US010318788B2

(12) United States Patent
Wang et al.

(10) Patent No.: US 10,318,788 B2
(45) Date of Patent: Jun. 11, 2019

(54) FINGERPRINT IDENTIFICATION DETECTION CIRCUIT, TOUCH SCREEN AND DISPLAY DEVICE (71) Applicant: BOE TECHNOLOGY GROUP CO., LTD., Beijing (CN)

(72) Inventors: Pengpeng Wang, Beijing (CN); Haisheng Wang, Beijing (CN); Xiaoliang Ding, Beijing (CN); Yingming Liu, Beijing (CN); Chihjen Cheng, Beijing (CN); Wei Liu, Beijing (CN); Xueyou Cao, Beijing (CN); Ping Zhang, Beijing (CN); Changfeng Li, Beijing (CN); Yunke Qin, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/963,288

(22) Filed: Apr. 26, 2018

(65) Prior Publication Data
US 2018/0300527 A1 Oct. 18, 2018

Related U.S. Application Data (63) Continuation-in-part of application No. PCT/CN2017/106856, filed on Oct. 19, 2017.

(30) Foreign Application Priority Data

Apr. 13, 2017 (CN) .......................... 2017 1 0240020

(51) Int. Cl.
G06K 9/00 (2006.01)
G06K 9/20 (2006.01)
(Continued)

(52) U.S. Cl.
CPC ......... *G06K 9/0004* (2013.01); *G06F 3/0421* (2013.01); *G06K 9/00087* (2013.01);
(Continued)

(58) Field of Classification Search
CPC .......................... G06K 9/0004; G06K 9/209; G06K 9/00087; G06F 3/0421; G06F 3/041; H01L 27/14612
(Continued)

(56) References Cited

U.S. PATENT DOCUMENTS

2009/0152664 A1 6/2009 Klem et al.
2010/0321356 A1 12/2010 Brown et al.
(Continued)

FOREIGN PATENT DOCUMENTS

CN 1612358 A 5/2005
CN 101946328 A 1/2011
(Continued)

OTHER PUBLICATIONS

Search Report for International Application No. PCT/CN2017/106856 dated Jan. 19, 2018.
(Continued)

*Primary Examiner* — Andrew M Moyer
(74) *Attorney, Agent, or Firm* — Calfee, Halter & Griswold LLP (57) ABSTRACT A fingerprint identification detection circuit, a touch screen and a display device is disclosed. The fingerprint identification detection circuit can include a photosensitive diode, a first switch transistor, a second switch transistor and a voltage follower transistor, wherein the first switch transistor can include a metal oxide transistor, and the second switch transistor and the voltage follower transistor both can include a low-temperature polycrystalline silicon transistor. There is little current leaking from the first switch transistor (Continued)

by using the metal oxide transistor as the first switch transistor. Even in the case of low light intensity, photocurrent can be detected, which may thereby improve the detection precision of the fingerprint identification detection circuit.

20 Claims, 8 Drawing Sheets

(51) Int. Cl.
*H01L 27/146* (2006.01)
*G06F 3/042* (2006.01)
*G06F 3/041* (2006.01)

(52) U.S. Cl.
CPC ........ *G06K 9/209* (2013.01); *H01L 27/14612* (2013.01); *G06F 3/041* (2013.01)

(58) Field of Classification Search
USPC ......................................................... 382/124
See application file for complete search history.

(56) References Cited

U.S. PATENT DOCUMENTS

| | | |
|---|---|---|
| 2013/0033450 A1 | 2/2013 | Coulson et al. |
| 2015/0205429 A1 | 7/2015 | Nie et al. |

FOREIGN PATENT DOCUMENTS

| | | |
|---|---|---|
| CN | 102017147 A | 4/2011 |
| CN | 103353814 A | 10/2013 |
| CN | 104112120 A | 10/2014 |
| CN | 105956584 A | 9/2016 |
| CN | 106292108 A | 1/2017 |
| CN | 106971172 A | 7/2017 |

OTHER PUBLICATIONS

First Office Action for Chinese Patent Application No. 201710240020X dated Apr. 2, 2019.

FINGERPRINT IDENTIFICATION DETECTION CIRCUIT, TOUCH SCREEN AND DISPLAY DEVICE

RELATED APPLICATIONS

The present application is a continuation-in-part of International Application No. PCT/CN2017/106856 with an International filing date of Oct. 19, 2017, which claims the benefit of Chinese Patent Application No. 201710240020.X, filed on Apr. 13, 2017, the entire disclosure of which is incorporated herein by reference.

TECHNICAL FIELD

The present disclosure relates to the field of display technology, and more particular to a fingerprint identification detection circuit, a touch screen and a display device.

BACKGROUND ART

At present, there are mainly capacitive and ultrasonic fingerprint identification devices. They, however, share a common defect that a sensor has a shorter sensing distance, which severely limits the structure and performance of fingerprint identification devices and affects their wide application in mobile terminal products.

An optical fingerprint identification device has the advantage of long-distance sensing. However, since an optical sensor requires high resolution, it can only be made in a small size. Since an optical signal quantity is usually proportional to the area of a sensor, the detected optical signal quantity may be very weak. Therefore, an active detection circuit is usually used for fingerprint identification and detection.

SUMMARY

The present disclosure provides a fingerprint identification detection circuit, a touch screen and a display device. Even in the case of low light intensity, photocurrent can be detected, which may thereby improve the detection precision of fingerprint identification.

According to one aspect of the present disclosure, there is provided a fingerprint identification detection circuit. The fingerprint identification detection circuit can comprise: a photosensitive diode, a first switch transistor, a voltage follower. A gate of the first switch transistor is connected with a reset control terminal, a first electrode of the first switch transistor is connected with a first reference voltage terminal, and a second electrode of the first switch transistor is connected with a first node. An input terminal of the voltage follower is connected with the first node, the voltage follower is configured to output a voltage at the first node via its output terminal. An anode of the photosensitive diode is connected with a third reference voltage terminal, and a cathode of the photosensitive diode is connected with the first node. The first switch transistor can comprise a metal oxide transistor.

In an embodiment, the fingerprint identification detection circuit can further comprise an output switching circuit. An input terminal of the output switching circuit is connected with the output terminal of the voltage follower. A control terminal of the output switching circuit is connected with a scanning signal terminal of the fingerprint identification detection circuit and receives therefrom a scanning signal for controlling the switch-on or switch-off of the output switching circuit. An output terminal of the output switching circuit is connected with a signal output terminal of the fingerprint identification detection circuit.

In an embodiment, the voltage follower comprises a voltage follower transistor, a gate of the voltage follower transistor acts as the input terminal of the voltage follower, a first electrode of the voltage follower transistor is connected with a second reference voltage terminal, and the second electrode of the voltage follower transistor acts as the output terminal of the voltage follower.

In an embodiment, the output switching circuit comprises a second switch transistor, a gate of the second switch transistor acts as the control terminal of the output switching circuit, a first electrode of the second switch transistor acts as the input terminal of the output switching circuit, and a second electrode of the second switch transistor acts as the output terminal of the output switching circuit.

In an embodiment, the second switch transistor and the voltage follower transistor both can comprise a low-temperature polycrystalline silicon transistor.

In an embodiment, films of the same function in the second switch transistor and the voltage follower transistor can be arranged in a same layer.

In an embodiment, the first electrode of the second switch transistor and the second electrode of the voltage follower transistor can be formed of a same electrode.

In an embodiment, the gate of the first switch transistor and the gate of the second switch transistor can be arranged in a same layer; and/or the first electrode of the first switch transistor and the first electrode of the second switch transistor can be arranged in a same layer.

In an embodiment, the first switch transistor can be located at a side of the second switch transistor away from the substrate.

In an embodiment, the fingerprint identification detection circuit can also comprise a third switch transistor. The third switch transistor can comprise a metal oxide transistor. A gate of the third switch transistor is connected with a compensation signal terminal, a first electrode of the third switch transistor is connected with the second electrode of the first switch transistor, a second electrode of the third switch transistor is connected with the first node, and the first and second electrodes of the third switch transistor are connected to each other. The potential of the reset control terminal can be inverted from the potential of the compensation signal terminal.

In an embodiment, the ratio between the aspect ratio of the first switch transistor and the aspect ratio of the third switch transistor is 2:1.

In an embodiment, the fingerprint identification detection circuit can also comprise an inverter a terminal of which is connected to the reset control terminal, and the compensation signal terminal is connected to the other terminal of the inverter.

In an embodiment, films of the same function in the first switch transistor and the third switch transistor can be arranged in a same layer.

In an embodiment, the first reference voltage terminal and the second reference voltage terminal can be a same voltage terminal.

According to another aspect of the present disclosure, there is provided a touch screen. The touch screen can comprise a plurality of the above-mentioned fingerprint identification detection circuits.

In an embodiment, the plurality of the above-mentioned fingerprint identification detection circuits are arranged in rows and columns, a first scanning line connected with a reset control terminal of the fingerprint identification detection circuit in each row respectively, a second scanning line connected with a scanning signal terminal of the fingerprint identification detection circuit in each row respectively, and a readout line connected with a signal output terminal of the fingerprint identification detection circuit in each column respectively.

In an embodiment, the touch screen can also comprise a current source and a signal processing circuit. A first terminal of the current source is connected with the signal output terminal of the fingerprint identification detection circuit and the signal processing circuit through the readout line, and a second terminal of the current source is connected with a fourth reference voltage terminal. The signal processing circuit can be configured to identify fingerprints according to a signal outputted from the signal output terminal of the fingerprint identification detection circuit.

In an embodiment, the first scanning line and the second scanning line Scan can be respectively located on two sides of the fingerprint identification detection circuits in each row.

In an embodiment, the touch screen can further comprise a gate line for each row in the row direction and a data line for each column in the column direction.

In an embodiment, the first scanning line and the gate line can be arranged in a same layer, or the second scanning line and the gate line can be arranged in a same layer.

In an embodiment, the readout line and the data line can be arranged in a same layer.

In an embodiment, the gate line can be re-used as the first scanning line or the second scanning line.

According to another aspect of the present disclosure, there is provided a display device, comprising any touch screen as stated above.

The Summary introduces, in a simplified form, some concepts of the present invention, which will be further described in the Detailed Description. The Summary is neither intended to provide essential or substantive features of the claimed subject matter, nor to limit the scope of the claimed subject matter. In addition, as stated herein, other various features and advantages can also be incorporated into these technologies as required.

BRIEF DESCRIPTION OF DRAWINGS

To illustrate the technical solutions of some embodiments of the present disclosure more clearly, the present disclosure provides the following drawings for describing the embodiments. It shall be appreciated that the following drawings are only related to some embodiments. Without making inventive labor, those ordinarily skilled in the art can also obtain other drawings according to these drawings, and the other drawings are within the scope of the present invention.

DETAILED DESCRIPTION

To understand the objects, technical solutions and advantages of some embodiments more clearly, implementations of a fingerprint identification detection circuit, a touch screen and a display device according to embodiments of the present disclosure will be described in detail with reference to the drawings.

The thickness and shape of films in each layer in the drawings do not reflect the real proportion of the fingerprint identification detection circuit, and the drawings are only aimed to schematically explain the implementations of some embodiments of the present disclosure.

Figure 1:
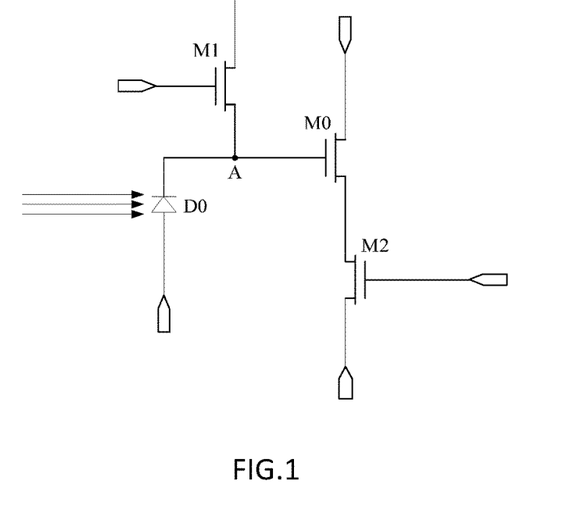
FIG. 1 is a structural schematic view of a fingerprint identification detection circuit according to a relevant technology.

FIG. 1 is a structural schematic view of a fingerprint identification detection circuit according to a relevant technology. The fingerprint identification detection circuit is an active fingerprint identification detection circuit. As shown in FIG. 1, the fingerprint identification detection circuit can comprise a first switch transistor M1, a second switch transistor M2, a voltage follower transistor M0 and a photosensitive diode D0. When an active fingerprint identification detection circuit is used to detect an optical signal of a fingerprint, it is required that first, the following effect of the voltage follower transistor M0 should be ideal and second, the cross-voltage of the second switch transistor M2 should be small so as to obtain an ideal output of the fingerprint identification detection circuit. In this case, the transistor needs to have a large mobility. Thus, in an active fingerprint identification detection circuit, the first switch transistor M1, the second switch transistor M2 and the voltage follower transistor M0 are often low-temperature polycrystalline silicon transistors. When a light shines on the photosensitive diode D0, a potential of a first node A will gradually decrease with the accumulation of photocurrent. However, when the light is very weak, the photocurrent generated is also weak. Since the first switch transistor M1 is a low-temperature polycrystalline silicon transistor, the potential of the first node A will gradually rise due to constant electrical leakage of the first switch transistor M1, such that the signal of the first node A cannot accumulate and the detection circuit is unable to identify a fingerprint.

The present disclosure provides a fingerprint identification detection circuit, a touch screen and a display device.

Photocurrent can be detected in the case of weak light, which can therefore improve the detection precision of fingerprint identification.

Figure 2:
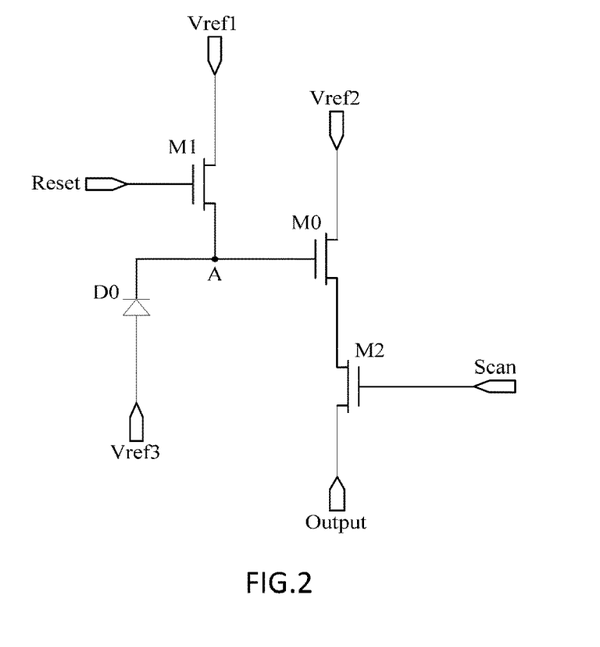
FIG. 2 is a structural schematic view of a fingerprint identification detection circuit according to an embodiment of the present disclosure.

FIG. 2 shows a structural schematic view of a fingerprint identification detection circuit according to an embodiment of the present disclosure. As shown in FIG. 2, the fingerprint identification detection circuit can comprise: a photosensitive diode D0 and a first switch transistor M1. A gate of the first switch transistor M1 is connected with a reset control terminal Reset, a first electrode of the first switch transistor M1 is connected with a first reference voltage terminal Vref1, and a second electrode of the first switch transistor M1 is connected with a first node A. An anode of the photosensitive diode D0 is connected with a third reference voltage terminal Vref3, and a cathode of the photosensitive diode D0 is connected with the first node A. The first switch transistor M1 can comprise a metal oxide transistor. The fingerprint identification detection circuit can further comprise a voltage follower an input terminal of which is connected with the first node A. The voltage follower is configured to output a voltage at the first node A via its output terminal.

In an implementation, the voltage follower can comprise a voltage follower transistor M0 as shown in FIG. 2. A gate of the voltage follower transistor M0 can act as the input terminal of the voltage follower and is connected with the first node A. A first electrode of the voltage follower transistor M0 is connected with a second reference voltage terminal Vref2. The second electrode of the voltage follower transistor M0 acts as the output terminal of the voltage follower.

In an embodiment, the fingerprint identification detection circuit can further comprise an output switching circuit. An input terminal of the output switching circuit is connected with the output terminal of the voltage follower. A control terminal of the output switching circuit is connected with a scanning signal terminal Scan of the fingerprint identification detection circuit and receives therefrom a scanning signal for controlling the switch-on or switch-off of the output switching circuit. An output terminal of the output switching circuit is connected with a signal output terminal of the fingerprint identification detection circuit.

In an implementation, the output switching circuit can comprise a second switch transistor M2. A gate of the second switch transistor M2 acts as the control terminal of the output switching circuit and is connected with a scanning signal terminal Scan of the fingerprint identification detection circuit. A first electrode of the second switch transistor M2 acts as the input terminal of the output switching circuit and is connected with a second electrode of the voltage follower transistor M0. A second electrode of the second switch transistor M2 acts as the output terminal of the output switching circuit and is connected with a signal output terminal Output of the fingerprint identification detection circuit. In an embodiment, the second switch transistor M2 and the voltage follower transistor M0 both can comprise a low-temperature polycrystalline silicon transistor.

Generally speaking, the fingerprint identification detection circuit can comprise: a photosensitive diode, a first switch transistor, a second switch transistor and a voltage follower transistor. Wherein, a gate of the first switch transistor is connected with a reset control terminal, a first electrode of the first switch transistor is connected with a first reference voltage terminal, and a second electrode of the first switch transistor is connected with a first node. A gate of the second switch transistor is connected with a scanning signal terminal of the fingerprint identification detection circuit, a first electrode of the second switch transistor is connected with a second electrode of the voltage follower transistor, and a second electrode of the second switch transistor is connected with a signal output terminal of the fingerprint identification detection circuit. A gate of the voltage follower transistor is connected with the first node, and a first electrode of the voltage follower transistor is connected with a second reference voltage terminal. An anode of the photosensitive diode is connected with a third reference voltage terminal, and a cathode of the photosensitive diode is connected with the first node. The first switch transistor can comprise a metal oxide transistor, and the second switch transistor and the voltage follower transistor both can comprise a low-temperature polycrystalline silicon transistor. There is little current leaking from the first switch transistor by using the metal oxide transistor as the first switch transistor. Even in the case of low light intensity, photocurrent can be detected, which may thereby improve the detection precision of the fingerprint identification detection circuit.

In an implementation, the material for an active layer of the second switch transistor and the voltage follower transistor can be a low-temperature polycrystalline silicon material, and the material for an active layer of the first switch transistor can be a metal oxide material.

It shall be explained that the fingerprint identification detection circuit according to the embodiment of the present disclosure can detect not only fingerprint identification, but also palm print identification, which will not be limited herein.

Figure 3A:
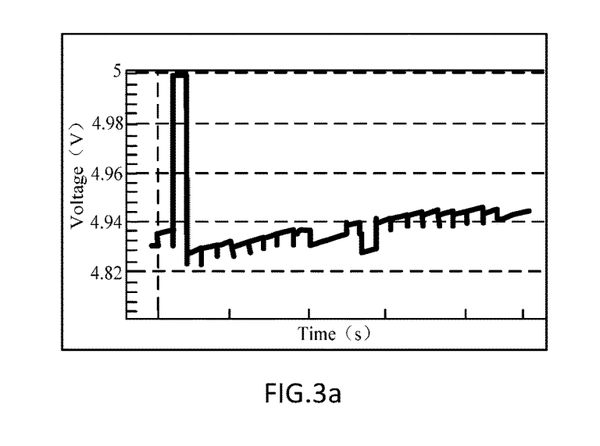
FIG. 3a is a signal simulation diagram of a potential of a first node A of the fingerprint identification detection circuit in FIG. 1.
Figure 3B:
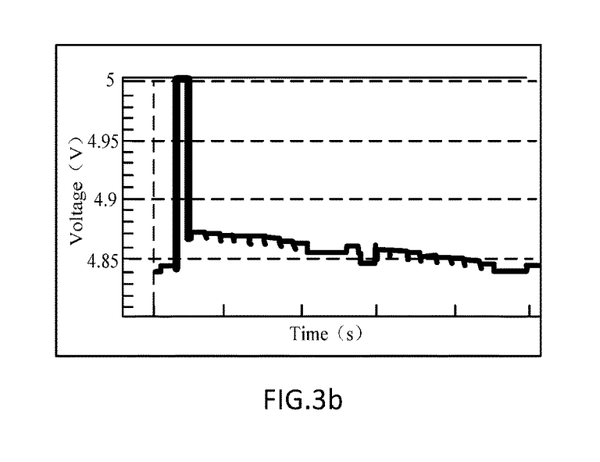
FIG. 3b is a signal simulation diagram of a potential of a first node A of the fingerprint identification detection circuit in FIG. 2.
Figure 3C:
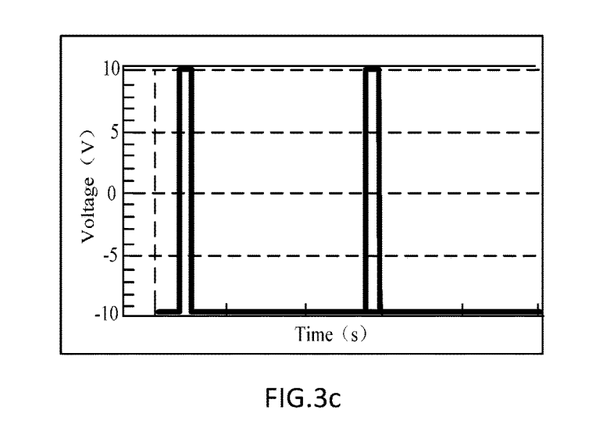
FIG. 3c is a simulation diagram of the potential of the first node A in FIGS. 1 and 2 after reset over time.

The fingerprint identification detection circuit shown in FIG. 1 is now compared with the fingerprint identification detection circuit shown in FIG. 2 through simulation, and the simulation result of the potential of the first node A after reset over time is shown in FIG. 3c. Under the condition of weak light that generates the photocurrent of 0.1 pA: the simulation result of the potential of the first node A of the fingerprint identification detection circuit in FIG. 1 over time is shown in FIG. 3a; and the simulation result of the potential of the first node A of the fingerprint identification detection circuit in FIG. 2 over time is shown in FIG. 3b. As seen from the simulation diagrams, since the first switch transistor M1 of the fingerprint identification detection circuit in FIG. 1 is a low-temperature polycrystalline silicon transistor that has a greater leakage current, the potential of the first node A gradually rises over time in the event of very weak photocurrent. Since the first switch transistor M1 constantly leaks current and the leaked current is greater than the generated photocurrent, under the condition of weak light, the potential of the first node A of the fingerprint identification detection circuit is mainly dependent on the leaked current of the first switch transistor M1, and fingerprint identification cannot be done. However, since the first switch transistor M1 of the fingerprint identification detection current in FIG. 2 is a metal oxide transistor that leaks a little current, the potential of the first node A gradually decreases over time, that is, the potential of the first node A is mainly dependent on the photocurrent. Even in the case of low light intensity, the fingerprint identification detection circuit in FIG. 2 can also detect photocurrent for the purpose of fingerprint identification.

In an implementation, in the fingerprint identification detection circuit, the low-temperature polycrystalline silicon transistor can be of a top-gate structure, i.e., the second switch transistor and the voltage follower transistor are of a top-gate structure.

In an implementation of the fingerprint identification detection circuit, the metal oxide transistor can be of a top-gate structure or a bottom-gate structure, i.e., the first switch transistor can be of a top-gate structure or a bottom-gate structure, which will not be limited herein.

In an implementation of the fingerprint identification detection circuit, the first electrode can be a drain electrode, and the second electrode can be a source electrode. Or alternatively, the first electrode can be a source electrode, and the second electrode can be a drain electrode, which will not be limited herein.

Figure 4:
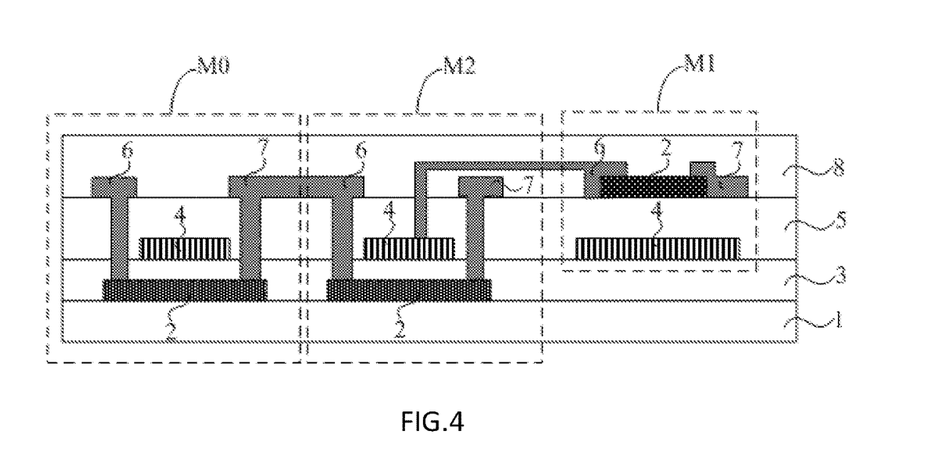
FIG. 4 is a structural schematic view of a fingerprint identification detection circuit according to another embodiment of the present disclosure.

FIG. 4 shows a structural schematic view of the fingerprint identification detection circuit according to another embodiment of the present disclosure. As shown in FIG. 4, films of the same function in the second switch transistor M2 and the voltage follower transistor M0 can be arranged in a same layer. For instance, a transistor usually comprises a gate electrode layer, an active layer and a source/drain electrode layer, etc. Thus, the gate electrode layers in the second switch transistor M2 and the voltage follower transistor M0 can be arranged in a same layer, the active layers in the second switch transistor M2 and the voltage follower transistor M0 can be arranged in a same layer, and the source/drain electrode layers in the second switch transistor M2 and the voltage follower transistor M0 can be arranged in a same layer. The pattern of films of the same function in the second switch transistor and the voltage follower transistor can be formed by one patterning process, which can simplify the preparation process, save production cost and improve production efficiency.

In an embodiment, in order to reduce the spatial area of the manufactured fingerprint identification detection circuit, as shown in FIG. 4, the first electrode of the second switch transistor M2 and the second electrode of the voltage follower transistor M0 can be formed of a same electrode, i.e., an electrode is connected to both the active layer of the second switch transistor M2 and the active layer of the voltage follower transistor M0.

In an embodiment, in order to simplify the production process and lower the production cost, as shown in FIG. 4, the gate of the first switch transistor M1 and the gate of the second switch transistor M2 can be arranged in a same layer.

In an embodiment, in order to simplify the production process and lower the production cost, as shown in FIG. 4, the first electrode of the first switch transistor M1 and the first electrode of the second switch transistor M2 can be arranged in a same layer.

In an embodiment, in order to simplify the production process and lower the production cost, as shown in FIG. 4, the gate of the first switch transistor M1 and the gate of the second switch transistor M2 can be arranged in a same layer, and the first electrode of the first switch transistor M1 and the first electrode of the second switch transistor M2 can be arranged in a same layer.

As used herein, the term "same layer" refers to the relationship between the layers simultaneously formed in the same step. In one example, the gate electrodes of the second switch transistor M2 and the voltage follower transistor M0 are in a same layer when they are formed as a result of one or more steps of a same patterning process performed in a same layer of material. In another example, the gate electrodes of the second switch transistor M2 and the voltage follower transistor M0 can be formed in a same layer by simultaneously performing the step of forming the gate electrode of the second switch transistor M2 and the step of forming the gate electrode of the voltage follower transistor M0. The term "same layer" does not always mean that the thickness of the layer or the height of the layer in a cross-sectional view is the same.

By taking the first switch transistor M1 having a bottom-gate structure as an example, the production process of the fingerprint identification detection circuit shown in FIG. 4 can be as follows:

(1) forming the pattern of the active layers 2 in the second switch transistor M2 and the voltage follower transistor M0 on a substrate 1 by one patterning process;

(2) forming the pattern of a gate insulating layer 3 above the active layers 2;

(3) forming the pattern of gate electrode layers 4 of the first switch transistor M1, the second switch transistor M2 and the voltage follower transistor M0 above the gate insulating layer 3 by one patterning process;

(4) forming the pattern of an interlayer dielectric layer 5 above the gate electrode layers 4;

(5) forming the pattern of the active layer 2 of the first switch transistor M1 above the interlayer dielectric layer 5;

(6) forming respectively the pattern of the source electrode layers 6 of the first switch transistor M1, the second switch transistor M2 and the voltage follower transistor M0 and the pattern of the drain electrode layers 7 of the first switch transistor M1, the second switch transistor M2 and the voltage follower transistor M0 above the interlayer dielectric layer 5 by one patterning process. It is noted that the connection between the source electrode of the first switch transistor M1 and the gate electrode of the second switch transistor M2, as shown in FIG. 4, seems to prevent said source electrode layers 6 and drain electrode layers 7 from being arranged at a same layer by only one patterning process. But it is not the case. In fact, the drain electrode layer 7 of the second switch transistor M2 may be formed on a part of the interlayer dielectric layer 5. The connection between the source electrode of the first switch transistor M1 and the gate electrode of the second switch transistor M2 can run beside and not overlap with the drain electrode layer 7 of the second switch transistor M2. Therefore, the pattern of the source electrode layers 6 and the pattern of the drain electrode layers 7 can be formed above the interlayer dielectric layer 5 by one patterning process; and (7) forming the pattern of a flat insulating layer 8 above the source electrode layers 6 and the drain electrode layers 7 of the first switch transistor M1, the second switch transistor M2 and the voltage follower transistor M0.

The first switch transistor M1, the second switch transistor M2 and the voltage follower transistor M0 formed by the above process are horizontally placed. Although the process can simplify the production process and reduce the production cost, the structure in which the three transistors are horizontally placed will greatly increase the spatial area of the fingerprint identification detection circuit, which is disadvantageous to the formation of a high-pixel touch screen.

Figure 5:
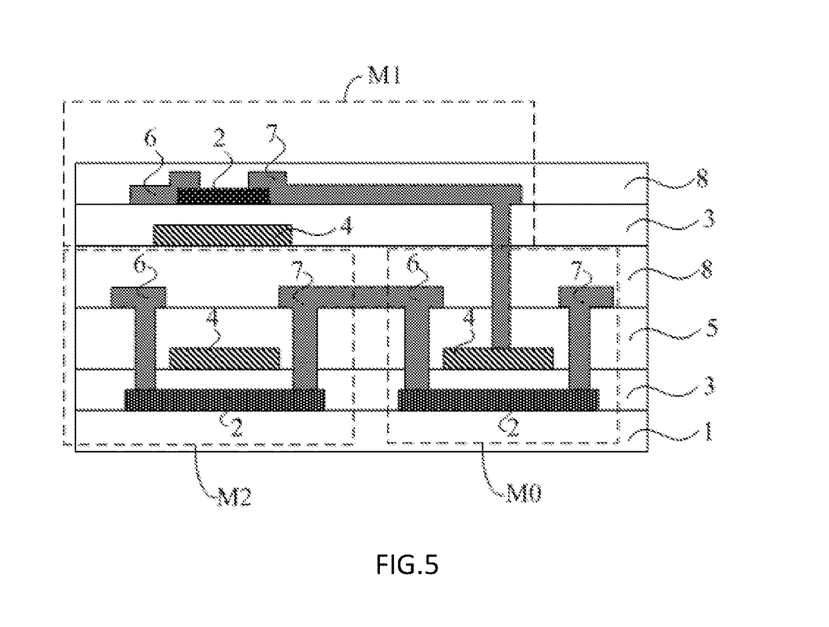
FIG. 5 is a structural schematic view of a fingerprint identification detection circuit according to another embodiment of the present disclosure.

FIG. 5 shows a structural schematic view of the fingerprint identification detection circuit according to another embodiment of the present disclosure. As shown in FIG. 5, the first switch transistor M1 is located above or below the second switch transistor M2, in such a way to reduce the space of the fingerprint identification detection circuit.

By taking the first switch transistor M1 having a bottom-gate structure and located above the second switch transistor M2 as an example, the production process of the fingerprint identification detection circuit in FIG. 5 can be as follows:

(1) forming the pattern of the active layers 2 in the second switch transistor M2 and the voltage follower transistor M0 on a substrate 1 by one patterning process;

(2) forming the pattern of a gate insulating layer 3 above the active layers 2;

(3) forming the pattern of gate electrode layers 4 of the second switch transistor M2 and the voltage follower transistor M0 above the gate insulating layer 3 by one patterning process;

(4) forming the pattern of an interlayer dielectric layer 5 above the gate electrode layers 4;

(5) forming respectively the pattern of the source electrode layers 6 of the second switch transistor M2 and the voltage follower transistor M0 and the pattern of the drain electrode layers 7 of the second switch transistor M2 and the voltage follower transistor M0 above the interlayer dielectric layer 5 by one patterning process;

(6) forming the pattern of a flat insulating layer 8 above the source electrode layers 6 and the drain electrode layers 7 of the second switch transistor M2 and the voltage follower transistor M0;

(7) forming the pattern of the gate electrode layer 4 of the first switch transistor M1 above the flat insulating layer 8;

(8) forming the pattern of the gate insulating layer 3 of the first switch transistor M1 above the gate electrode layer 4;

(9) forming the pattern of the active layer 2 of the first switch transistor M1 above the gate insulating layer 3;

(10) forming respectively the source electrode layer 6 and the drain electrode layer 7 of the first switch transistor M1 above the active layer 2 by one patterning process; and (11) forming the pattern of the flat insulating layer 8 above the source electrode layer 6 and the drain electrode layer 7 of the first switch transistor M1.

The first switch transistor M1, the second switch transistor M2 and the voltage follower transistor M0 formed by the above process are of a vertical structure, in such a way to reduce the spatial area of the manufactured circuit.

Figure 6:
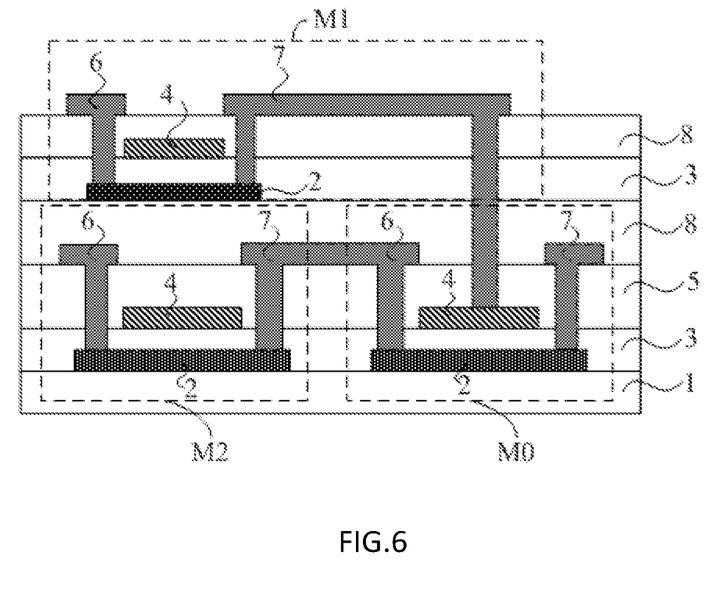
FIG. 6 is a structural schematic view of a fingerprint identification detection circuit according to another embodiment of the present disclosure.

FIG. 6 shows a structural schematic view of the fingerprint identification detection circuit according to another embodiment of the present disclosure. As shown in FIG. 6, the first switch transistor M1 can also have a top-gate structure. The specific production process of the top-gate structure is the same as the current one, which will not be reiterated herein.

Figure 7:
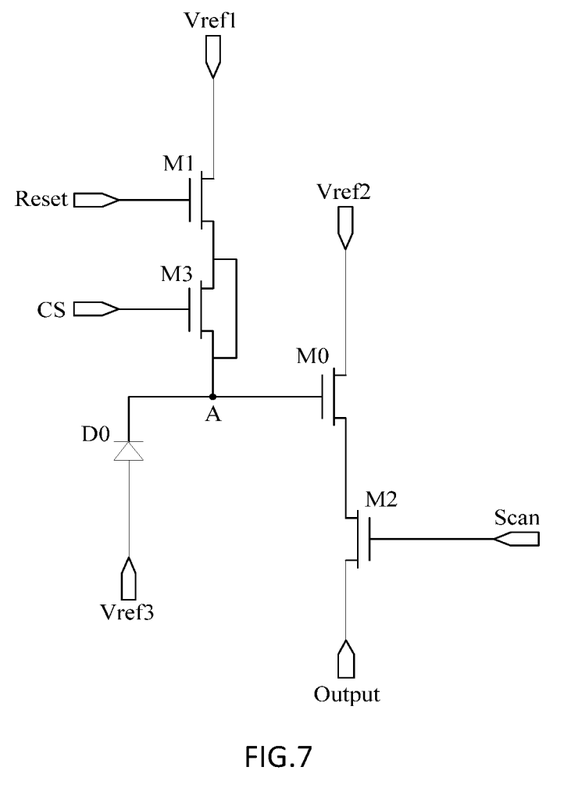
FIG. 7 is a structural schematic view of a fingerprint identification detection circuit according to another embodiment of the present disclosure.

In the above embodiment, a metal oxide transistor is used as the first switch transistor, so that non-accumulation of the signal potential of the first node A as a result of current leakage, which may give rise to failure to detect the fingerprint identification, can be avoided. However, since the gate of the metal oxide transistor is connected to a clock signal and needs to be opened under a higher driving pressure, it may cause greater noise for the fingerprint identification detection circuit, i.e., it generates noise at the first node A, which may affect the detection precision of the fingerprint identification detection circuit. Thus, FIG. 7 shows a structural schematic view of the fingerprint identification detection circuit according to another embodiment of the present disclosure. As shown in FIG. 7, the fingerprint identification detection circuit can also comprise a third switch transistor M3. The third switch transistor M3 can comprise a metal oxide transistor, so as to prevent the current leakage of the third switch transistor M3 from affecting the fingerprint identification. A gate of the third switch transistor M3 can be connected with a compensation signal terminal CS, a first electrode of the third switch transistor M3 is connected with the second electrode of the first switch transistor M1, a second electrode of the third switch transistor M3 is connected with the first node A, and the first and second electrodes of the third switch transistor M3 are connected to each other. The potential of the reset control terminal Reset is inverted from the potential of the compensation signal terminal CS. Thus, the noise generated by the first switch transistor M1 can be eliminated by reasonably arranging the ratio between the aspect ratio of the first switch transistor and the aspect ratio of the third switch transistor.

In an embodiment, the ratio between the aspect ratio of the first switch transistor and the aspect ratio of the third switch transistor is 2:1.

As for the first switch transistor M1, when the falling edge of the clock at its reset control terminal Reset occurs, the first switch transistor M1 will generate noise $\Delta V_{c1}$ caused by clock feedthrough and noise $\Delta V_{g1}$ caused by charge injection, i.e., the generated noise at that time is $\Delta V_{c1}+\Delta V_{g1}$. As for the third switch transistor M3, since the potential of the compensation signal terminal CS is inverted from the potential of the reset control terminal Reset of the first switch transistor M1, the clock of the compensation signal terminal CS of the third switch transistor M3 has a rising edge; and since the first electrode and the second electrode of the third switch transistor M3 are connected to each other, the noise generated by the third switch transistor M3 is the superimposed noises generated at the first electrode and the second electrode of the third switch transistor M3, i.e., $-2\Delta V_{c2}-2\Delta V_{g2}$. Since the ratio between the aspect ratio of the first switch transistor M1 and the aspect ratio of the third switch transistor M3 is 2:1, $\Delta V_{c1}=2\Delta V_{c2}$, $\Delta V_{g1}=2\Delta V_{g2}$, and the total noise at the first node A is $\Delta V_{c1}+\Delta V_{g1}+(-2\Delta V_{c2}-2\Delta V_{g2})=0$, which can counteract the noise generated by the first switch transistor M1 and the third switch transistor M3, thereby improving the detection precision of fingerprint detection under weak photocurrent.

Figure 8:
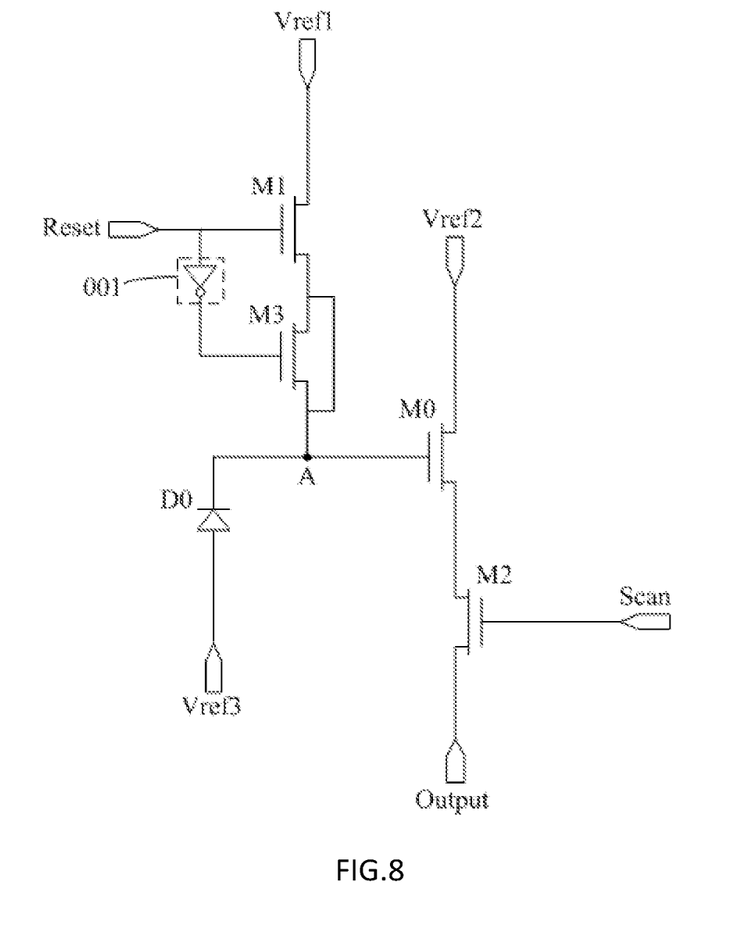
FIG. 8 is a structural schematic view of a fingerprint identification detection circuit according to another embodiment of the present disclosure.

FIG. 8 shows a structural schematic view of the fingerprint identification detection circuit according to another embodiment of the present disclosure. As shown in FIG. 8, the fingerprint identification detection circuit may also comprise an inverter 001 connected to the reset control terminal Reset, and the compensation signal terminal CS is connected to the other terminal of the inverter 001. In this case, it is only required to connect the reset control terminal Reset to the gate of the first switch transistor M1, the clock signal of the reset control terminal Reset changes to the clock signal with the inverted potential through the inverter 001 before being inputted into the gate of the third switch transistor M3. Thus, it is not necessary to add an extra compensation signal inverted from the signal inputted by the reset control terminal Reset, which can reduce costs.

Figure 9:
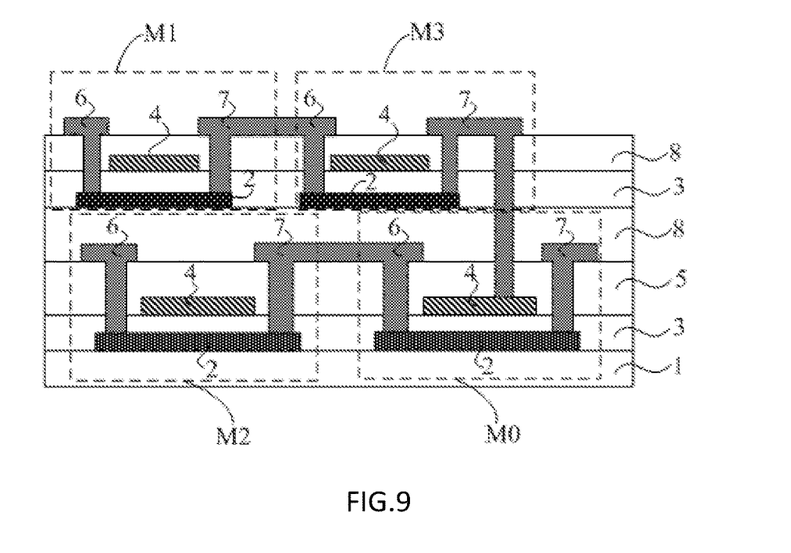
FIG. 9 is a structural schematic view of a fingerprint identification detection circuit according to another embodiment of the present disclosure.

FIG. 9 shows a structural schematic view of the fingerprint identification detection circuit according to another embodiment of the present disclosure. As shown in FIG. 9, films of the same function in the first switch transistor M1 and the third switch transistor M3 can be arranged in a same layer. For instance, a transistor usually comprises a gate electrode layer, an active layer and a source/drain electrode layer, etc. Thus, the gate electrode layer of the first switch transistor M1 and the third switch transistor M3 can be arranged in a same layer, the active layer of the first switch transistor M1 and the third switch transistor M3 can be arranged in a same layer, and the source/drain electrode layer of the first switch transistor M1 and the third switch transistor M3 can be arranged in a same layer. Also, the gate electrode layers in the second switch transistor M2 and the voltage follower transistor M0 can be arranged in a same layer, the active layers in the second switch transistor M2 and the voltage follower transistor M0 can be arranged in a same layer, and the source/drain electrode layers in the second switch transistor M2 and the voltage follower transistor M0 can be arranged in a same layer. The specific production process thereof is the same as the current one, which will not be reiterated herein. In doing so, the pattern of films of the same function in the first switch transistor M1 and the third switch transistor M3 can be formed by one patterning process, and the pattern of films of the same function in the second switch transistor M2 and the voltage follower transistor M0 can be formed by one patterning process, which can simplify the preparation process, save production cost and improve production efficiency. Wherein, the first switch transistor M1, the second switch transistor M2 and the voltage follower transistor M0 are manufactured by way of stacking, so the added third switch transistor M3 is manufactured in the same layer as the first switch transistor M1, which will not increase the spatial area of the produced circuit.

Figure 10:
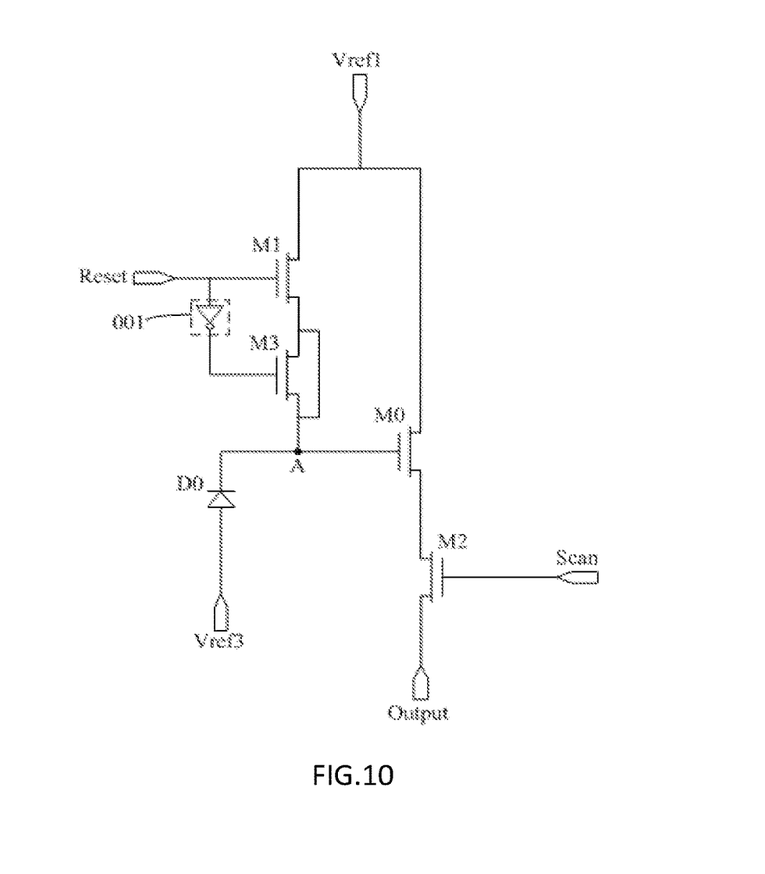
FIG. 10 is a structural schematic view of a fingerprint identification detection circuit according to another embodiment of the present disclosure.

FIG. 10 shows a structural schematic view of the fingerprint identification detection circuit according to another embodiment of the present disclosure. As shown in FIG. 10, the first reference voltage terminal Vref1 and the second reference voltage terminal Vref2 are the same voltage terminal, which can save one reference voltage terminal, thereby reducing costs.

In an implementation, all the transistors in the fingerprint identification detection circuit can be N-type transistors or P-type transistors, which will not be limited herein.

Figure 11:
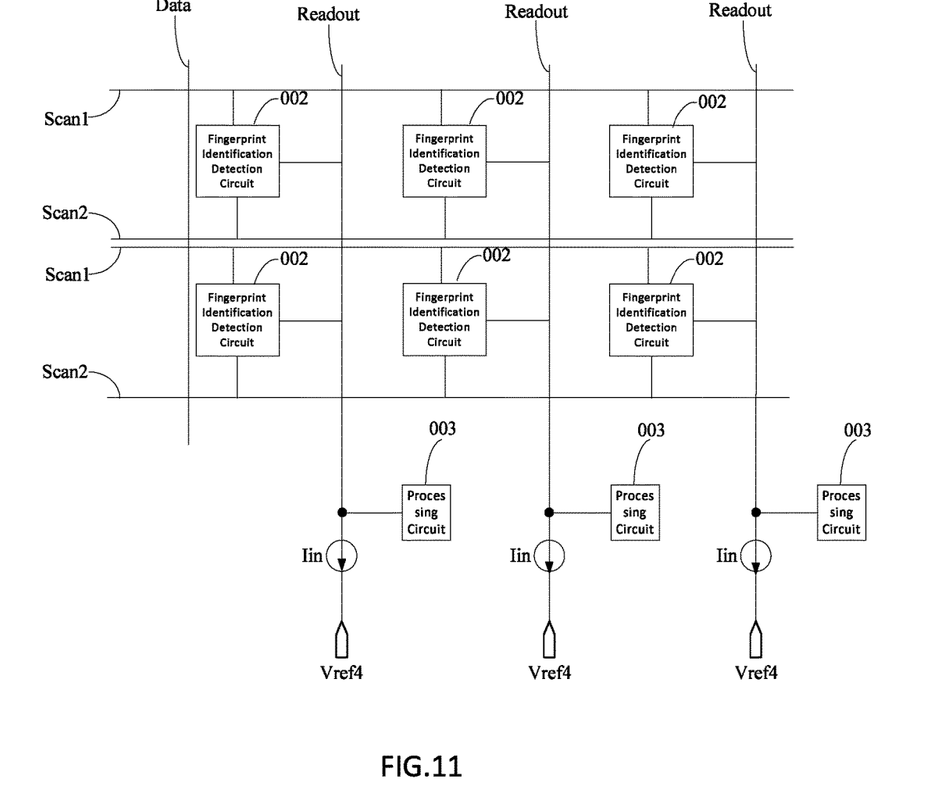
FIG. 11 is a structural schematic view of a touch screen according to an embodiment of the present disclosure.

FIG. 11 shows a structural schematic view of a touch screen according to an embodiment of the present disclosure. As shown in FIG. 11, the touch screen can comprise a plurality of the above-mentioned fingerprint identification detection circuits 002 arranged in rows and columns, a first scanning line Scan 1 connected with a reset control terminal of the fingerprint identification detection circuit 002 in each row respectively, a second scanning line Scan 2 connected with a scanning signal terminal of the fingerprint identification detection circuit 002 in each row respectively, and a readout line Readout connected with a signal output terminal of the fingerprint identification detection circuit in each column respectively.

In an embodiment, as shown in FIG. 11, the first scanning line Scan 1 and the second scanning line Scan 2 correspondingly connected with the fingerprint identification detection circuits 002 in each row are respectively located on two sides of the fingerprint identification detection circuits 002 in each row. Wherein, the first scanning line Scan 1 is located above the fingerprint identification detection circuits 002, and the second scanning line Scan 2 is located below the fingerprint identification detection circuits 002. Or alternatively, the first scanning line Scan 1 is located below the fingerprint identification detection circuits 002, and the second scanning line Scan 2 is located above the fingerprint identification detection circuits 002, which will not be limited herein.

In an embodiment, when the first scanning line Scan 1 is located above the fingerprint identification detection circuits 002 in the n-th row and the second scanning line Scan 2 is located below the fingerprint identification detection circuits 002 in the (n−1)th row, the first scanning line Scan 1 corresponding to the fingerprint identification detection circuits 002 in the n-th row and the second scanning line Scan 2 corresponding to the fingerprint identification detection circuits 002 in the (n−1)th row can be the same scanning line.

In the touch screen, a gate line can usually be arranged in a row direction, and a data line Data can usually be arranged in a column direction. The first scanning line Scan 1 and the second scanning line Scan 2 extend in the same direction as the gate, and the readout line Readout extends in the same direction as the data line Data.

In an embodiment, the first scanning line and the gate line can be arranged in a same layer, and the second scanning line and the gate line can be arranged in a same layer, which will not be limited herein.

In an embodiment, the readout line and the data line can be arranged in a same layer, which will not be limited herein.

In an embodiment, the gate line can be re-used as the first scanning line, and the gate line can also be re-used as the second scanning line, which will not be limited herein.

In an embodiment, as shown in FIG. 11, the touch screen can also comprise a current source Iin and a signal processing circuit 003. The first terminal of the current source Iin can be connected with the signal output terminal of the fingerprint identification detection circuit 002 and the signal processing circuit 003 through the readout line Readout, and the second terminal of the current source Iin can be connected with the fourth reference voltage terminal Vref4. The signal processing circuit 003 can be configured to identify a fingerprint according to the signal outputted from the signal output terminal of the fingerprint identification detection circuit 002.

In an embodiment, each readout line can correspond to a signal processing circuit, or a plurality of readout lines can correspond to a signal processing circuit, which will not be limited herein.

In an embodiment, the touch screen can also comprise a black matrix layer. In the fingerprint identification detection circuit, except the photosensitive diode, the first switch transistor, the second switch transistor, the voltage follower transistor and the third switch transistor can all be arranged below the black matrix layer.

According to another aspect of the present disclosure, there is also provided a display device. The display device comprises any touch screen as stated above. The display device can comprise any product or component having a display function, such as a mobile phone, a tablet, a TV, a display, a lap-top computer, a digital frame or a navigator. Other indispensible constituents of the display device are requisites according to the understanding of those ordinarily skilled in the art, which will not be reiterated herein, and shall not be regarded as limitations to the present invention. Reference can be made to the embodiments of the touch screen for the implementation of the display device, which will not be reiterated herein.

In the fingerprint identification detection circuit, the touch screen and the display device provided by the embodiments of the present disclosure, since the metal oxide transistor is used as the first switch transistor of the fingerprint identification detection circuit, there is little current leaking from the first switch transistor. Even in the case of low light intensity, photocurrent can be detected, which may thereby improve the detection precision of the fingerprint identification detection circuit.

It can be understood that the above embodiments are only exemplary embodiments of the present invention, but the protection scope of the present invention is not limited thereto. It shall be pointed out that those ordinarily skilled in the art can readily conceive of various variations or replacements without departing from the spirit and principle of the present invention. These variations or replacements will fall within the protection scope of the present invention. Thus, the protection scope of the present invention shall be based on the protection scope of the appended claims.

The present application uses such wordings as "first", "second" and "third". Unless specified in the context, such wordings do not imply any order, but are actually used for the purpose of identification. For instance, the phrases "first switch transistor" and "second switch transistor" do not necessarily mean the first switch transistor is positioned in front of the second switch transistor, or is processed or controlled earlier than the second switch transistor. In fact, these phrases are only used to identify different switch transistors.

In the claims, any reference sign in parentheses should not be interpreted as a limitation to the claims. The terms "comprise", "include" and similar terms do not exclude the presence of elements or steps other than those listed in the claims. The word "a" or "an" in front of elements does not exclude the presence of a plurality of such elements.

What is claimed is:

1. A fingerprint identification detection circuit, comprising a photosensitive diode, a first switch transistor, a voltage follower a second switch transistor and a voltage follower transistor, wherein
a gate of the first switch transistor is connected with a reset control terminal, a first electrode of the first switch transistor is connected with a first reference voltage terminal, and a second electrode of the first switch transistor is connected with a first node;
a gate of the second switch transistor is connected with a scanning signal terminal of the fingerprint identification detection circuit, a first electrode of the second switch transistor is connected with a second electrode of the voltage follower transistor, and a second electrode of the second switch transistor is connected with a signal output terminal of the fingerprint identification detection circuit;
an input terminal of the voltage follower is connected with the first node, the voltage follower is configured to output a voltage at the first node via its output terminal a gate of the voltage follower transistor is connected with the first node, and a first electrode of the voltage follower transistor is connected with a second reference voltage terminal; an anode of the photosensitive diode is connected with a third reference voltage terminal, and a cathode of the photosensitive diode is connected with the first node; and
the first switch transistor comprises a metal oxide transistor, and the second switch transistor and the voltage follower transistor both comprise a low-temperature polycrystalline silicon transistor.

2. The fingerprint identification detection circuit according to claim 1, further comprising a third switch transistor, wherein
the third switch transistor comprise a metal oxide transistor;
a gate of the third switch transistor is connected with a compensation signal terminal, a first electrode of the third switch transistor is connected with the second electrode of the first switch transistor, a second electrode of the third switch transistor is connected with the first node, and the first and second electrodes of the third switch transistor are connected to each other; and
the potential of the reset control terminal is inverted from the potential of the compensation signal terminal.

3. The fingerprint identification detection circuit according to claim 2, wherein the ratio between the aspect ratio of the first switch transistor and the aspect ratio of the third switch transistor is 2:1.

4. The fingerprint identification detection circuit according to claim 2, wherein it further comprises an inverter a terminal of which is connected to the reset control terminal, and the compensation signal terminal is connected to the other terminal of the inverter.

5. The fingerprint identification detection circuit according to claim 2, wherein films of the same function in the first switch transistor and the third switch transistor can be arranged in a same layer.

6. A touch screen, comprising a plurality of fingerprint identification detection circuits according to claim 1.

7. A display device, comprising the touch screen according to claim 6.

8. The fingerprint identification detection circuit according to claim 1, further comprising an output switching circuit,
wherein an input terminal of the output switching circuit is connected with the output terminal of the voltage follower,
a control terminal of the output switching circuit is connected with a scanning signal terminal of the fingerprint identification detection circuit and receives therefrom a scanning signal for controlling the switch-on or switch-off of the output switching circuit, and
an output terminal of the output switching circuit is connected with a signal output terminal of the fingerprint identification detection circuit.

9. The fingerprint identification detection circuit according to claim 8, wherein the voltage follower comprises a voltage follower transistor, a gate of the voltage follower transistor acts as the input terminal of the voltage follower, a first electrode of the voltage follower transistor is connected with a second reference voltage terminal, and the second electrode of the voltage follower transistor acts as the output terminal of the voltage follower.

10. The fingerprint identification detection circuit according to claim 9, wherein films of the same function in the second switch transistor and the voltage follower transistor can be arranged in a same layer.

11. The fingerprint identification detection circuit according to claim 9, wherein the first electrode of the second switch transistor and the second electrode of the voltage follower transistor can be formed of a same electrode.

12. The fingerprint identification detection circuit according to claim 9, wherein the gate of the first switch transistor and the gate of the second switch transistor can be arranged in a same layer; and/or
the first electrode of the first switch transistor and the first electrode of the second switch transistor can be arranged in a same layer.

13. The fingerprint identification detection circuit according to claim 9, wherein the first reference voltage terminal and the second reference voltage terminal are the same voltage terminal.

14. The fingerprint identification detection circuit according to claim 9, wherein the output switching circuit comprises a second switch transistor, a gate of the second switch transistor acts as the control terminal of the output switching circuit, a first electrode of the second switch transistor acts as the input terminal of the output switching circuit, and a second electrode of the second switch transistor acts as the output terminal of the output switching circuit.

15. The fingerprint identification detection circuit according to claim 14, wherein the first switch transistor is located at a side of the second switch transistor away from the substrate.

16. The fingerprint identification detection circuit according to claim 14, wherein the second switch transistor and the voltage follower transistor both comprise a low-temperature polycrystalline silicon transistor.

17. The touch screen according to claim 6, wherein the plurality of fingerprint identification detection circuits are arranged in rows and columns, a first scanning line connected with the reset control terminal of the fingerprint identification detection circuit in each row respectively, a second scanning line connected with the scanning signal terminal of the fingerprint identification detection circuit in each row respectively, and a readout line connected with the signal output terminal of the fingerprint identification detection circuit in each column respectively.

18. The touch screen according to claim 17, further comprising a current source and a signal processing circuit, wherein a first terminal of the current source is connected with the signal output terminal of the fingerprint identification detection circuit and the signal processing circuit through the readout line, and a second terminal of the current source is connected with a fourth reference voltage terminal; and the signal processing circuit is configured to identify fingerprints according to a signal outputted from the signal output terminal of the fingerprint identification detection circuit.

19. The touch screen according to claim 17, wherein the first scanning line and the second scanning line Scan are respectively located on two sides of the fingerprint identification detection circuits in each row.

20. The touch screen according to claim 17, further comprising a gate line for each row in the row direction, wherein the gate line is re-used as the first scanning line or the second scanning line.

* * * * *